United States Patent
Choi et al.

(10) Patent No.: US 8,305,806 B2
(45) Date of Patent: Nov. 6, 2012

(54) NONVOLATILE MEMORY DEVICE AND METHOD FOR CONTROLLING WORD LINE OR BIT LINE THEREOF

(75) Inventors: Joon-Yong Choi, Gwacheon-si (KR); Byunggil Choi, Yongin-si (KR); Yu Hwan Ro, Seongnam-si (KR); Yong-Jun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 302 days.

(21) Appl. No.: 12/659,690

(22) Filed: Mar. 17, 2010

(65) Prior Publication Data
US 2010/0284221 A1 Nov. 11, 2010

(30) Foreign Application Priority Data
May 6, 2009 (KR) ........................ 10-2009-0039375

(51) Int. Cl.
*G11C 16/04* (2006.01)
(52) U.S. Cl. .......... 365/185.05; 365/185.13; 365/189.09
(58) Field of Classification Search ............. 365/185.05, 365/185.13, 185.23, 230.06
See application file for complete search history.

(56) References Cited

U.S. PATENT DOCUMENTS

| | | | |
|---|---|---|---|
| 6,781,904 B2 * | 8/2004 | Lee et al. | 365/207 |
| 6,917,541 B2 * | 7/2005 | Shimbayashi et al. | 365/185.05 |
| 2003/0210581 A1 * | 11/2003 | Lee et al. | 365/200 |
| 2006/0221708 A1 | 10/2006 | Higashitani | |

FOREIGN PATENT DOCUMENTS

| | | |
|---|---|---|
| JP | 04-003394 | 1/1992 |
| JP | 08-273381 | 10/1996 |

* cited by examiner

*Primary Examiner* — Gene Auduong
(74) *Attorney, Agent, or Firm* — Harness, Dickey & Pierce

(57) ABSTRACT

A nonvolatile memory device includes global selection lines, local selection lines, a first selection circuit, and a second selection circuit. The local lines correspond respectively to the global selection lines. The first selection circuit is configured to connect to the global selection lines to select the global selection lines. The second selection circuit is connected between the global selection lines and the local selection lines and is configured to select the local selection lines. The first selection circuit is configured to select at least one global selection line, and the second selection circuit is configured to select the local selection lines corresponding to the selected global selection line while the at least one global selection line is continuously activated.

9 Claims, 6 Drawing Sheets

NONVOLATILE MEMORY DEVICE AND METHOD FOR CONTROLLING WORD LINE OR BIT LINE THEREOF

CROSS-REFERENCE TO RELATED APPLICATIONS

This U.S. non-provisional patent application claims priority under 35 U.S.C. §119 of Korean Patent Application No. 10-2009-0039375, filed on May 6, 2009, the entire contents of which are hereby incorporated by reference.

BACKGROUND

Example embodiments relate to methods of controlling lines of a nonvolatile memory device, and more particularly, to methods for controlling global lines and local lines of a nonvolatile memory device.

Semiconductor memory devices store data and enable the stored data to be read when necessary. The semiconductor memory devices are classified into volatile memory devices and nonvolatile memory devices.

The volatile memory devices lose data stored therein when power supply thereto is interrupted. Examples of the volatile memory devices include, for example, static random access memory (SRAM) devices, dynamic random access memory (DRAM) devices, and synchronous dynamic random access memory (SDRAM) devices. The nonvolatile memory devices retain data stored therein even when power supply thereto is interrupted. Examples of the nonvolatile memory devices include, for example, read-only memory (ROM) devices, programmable read-only memory (PROM) devices, erasable programmable read-only memory (EPROM) devices, electrically erasable programmable read-only memory (EEPROM) devices, flash memory devices, phase-change random access memory (PRAM) devices, magnetic random access memory (MRAM) devices, resistive random access memory (RRAM) devices, and ferroelectric random access memory (FRAM) devices.

SUMMARY

Example embodiments of the inventive concepts are directed to a nonvolatile memory device and a line control method thereof, which can reduce a program time, a read time and/or an erase time.

According to an example embodiment of the inventive concepts, a method for controlling lines of a nonvolatile memory device may include selectively activating a global selection line of the nonvolatile memory device; and selectively activating at least two local selection lines of the nonvolatile memory device, the activated local selection lines being connected to the global selection line while the global selection line is activated.

According to an example embodiment of the inventive concepts, the method may further include selectively activating the local selection lines connected to the global selection line in a random order.

According to an example embodiment of the inventive concepts, the method may further include selectively activating the at least two local selection lines connected to the global selection line in a sequential order.

According to an example embodiment of the inventive concepts, the method may further include supplying a boosted power supply voltage to selectively activate the global selection line and the local selection line.

According to an example embodiment of the inventive concepts, a nonvolatile memory device may include a plurality of global selection lines; a plurality of local selection lines corresponding to the plurality of global selection lines; a first selection circuit connected to the plurality of global selection lines to select at least one of the plurality of global selection lines; and a second selection circuit connected between the plurality of global selection lines and the plurality of local selection lines and configured to select the local selection lines, According to an example embodiment of the inventive concepts, the first selection circuit may select at least one global selection line of the plurality of global selection lines, and the second selection circuit may select at least two local selection lines of the plurality of local selection lines. The selected at least two local selection lines may correspond to the selected at least one global selection line and the at least two local selection lines may be selected while the at least one global selection line is activated.

According to an example embodiment of the inventive concepts, the second selection circuit may select the at least two local selection lines in a random order while the selected global selection line is continuously activated.

According to an example embodiment of the inventive concepts, the first selection circuit may include global transistors connected to the global selection lines. The global transistors may be configured to select the at least one global selection line in response to a global select signal, and the global select signal may be continuously activated and supplied to selected global transistor while the local selection lines corresponding to the selected global transistor are selected.

According to an example embodiment of the inventive concepts, the second selection circuit may include a plurality of local transistors connected to the plurality of local selection lines. The plurality of local transistors may be configured to select the plurality of local selection lines in response to a local select signal, the local select signal may be supplied to at least two local transistors of the plurality of local transistors in a random order while the selected at least one global selection line is continuously activated, and the at least two local transistors may correspond to the selected at least one global selection line.

According to an example embodiment of the inventive concepts, a voltage that generates the global select signal and local select signal may be boosted before the local select signal is supplied to the at least two local transistors.

According to an example embodiment of the inventive concepts, a voltage that generates the global select signal may not be boosted while the local select signal is supplied to at least two selected local transistors.

According to an example embodiment of the inventive concepts, the second selection circuit may sequentially select the at least two local selection lines corresponding to the selected at least one global selection line while the selected global selection line is activated.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EXAMPLE EMBODIMENTS

Figure 1:
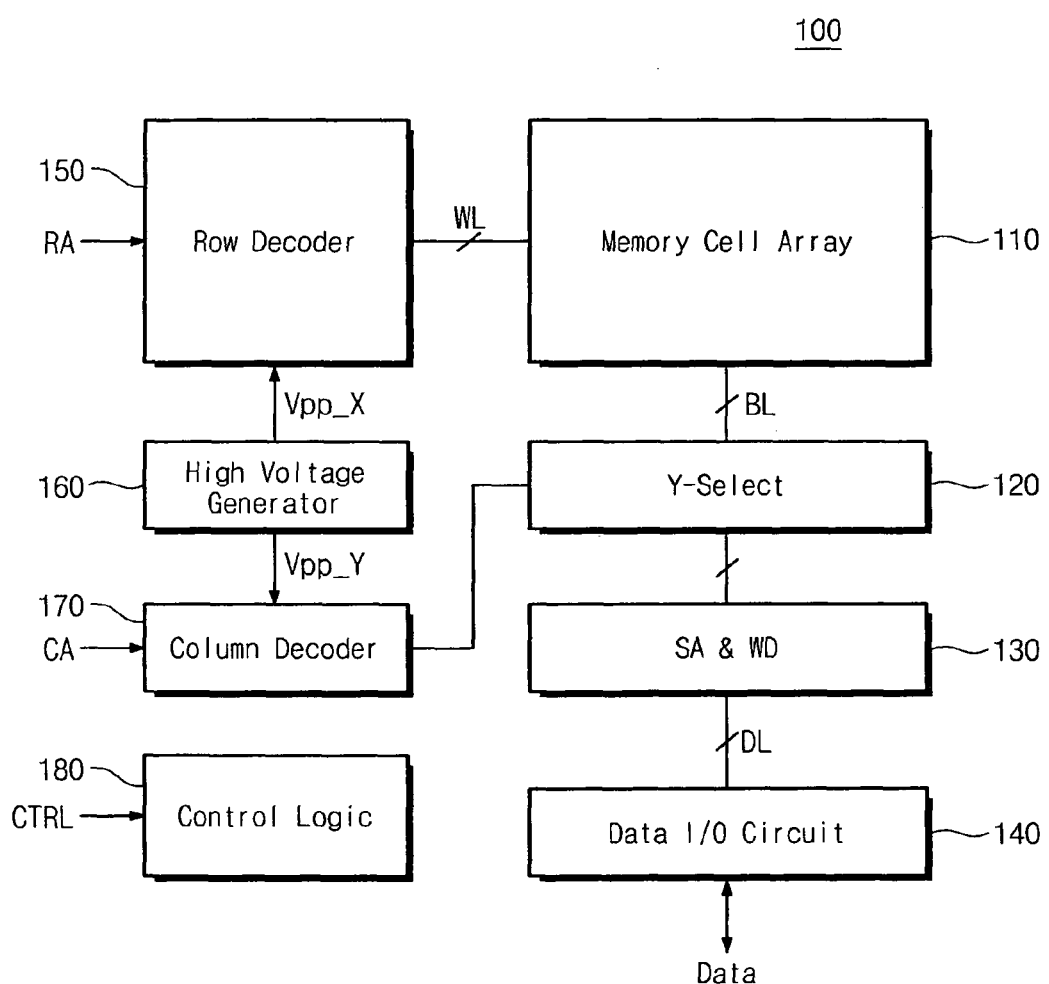
FIG. 1 is a block diagram of a nonvolatile memory device according to an example embodiment of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is riot intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a nonvolatile memory device according to an example embodiment of the inventive concepts.

Referring to FIG. 1, a nonvolatile memory device 100 according to an example embodiment of the inventive concepts includes a memory cell array 110, a column selector (Y-Select) 120, a sense amplification and write drive (SA & WD) circuit 130, a data input/output (I/O) circuit 140, a row decoder 150, a high voltage generator 160, a column decoder 170, and a control logic unit 180.

The memory cell array 110 includes a plurality of memory cells. For example, the memory cells may include a phase-change memory cells, the resistance of which may vary according to temperature. For example, the memory cells may include flash memory cells, FRAM cells, MRAM cells, RRAM cells, or the like.

The memory cells are connected to hierarchical bit lines or word lines. For example, the bit lines may include local bit lines LBL and global bit lines GBL. For example, the word lines may include local word lines LWL and global word lines GWL. The global bit lines GBL and the global word lines GWL will be referred to as global lines. The local bit lines LBL and the local word lines LWL will be referred to as local lines.

The hierarchical structure of the bit lines will be described later with reference to FIG. 2. The hierarchical structure of the word lines will be described later with reference to FIG. 5.

The column selector 120 is connected using the bit lines to the memory cell array 110. The column selector 120 selects the bit lines in response to a control of the column decoder 170. The selected bit lines are electrically connected through the column selector 120 to the SA & WD circuit 130.

The column selector 120 selects the bit lines using hierarchical transistors. The structure of the column selector 120 will be described later in detail with reference to FIG. 2.

The SA & WD circuit 130 is electrically connected to the bit lines selected by the column selector 120. The SA & WD circuit 130 senses data stored in the memory cells connected to the selected bit lines. The SA & WD circuit 130 writes data in the memory cells connected to the selected bit lines.

The SA & WD circuit 130 includes a plurality of sense amplifiers/write drivers (not illustrated). Each of the sense amplifiers/write drivers senses data stored in the memory cell connected to the corresponding bit line. Each of the sense amplifiers/write drivers writes data in the memory cell connected to the corresponding bit line. The SA & WD circuit 130 is connected to the data I/O circuit 140.

The data I/O circuit 140 exchanges data with an external device. Write data transferred from the external device to the data I/O circuit 140 are transferred through data lines DL to the SA & WD circuit 130. The write data transferred to the SA & WD circuit 130 are written in the memory cell connected to the bit line selected by the column selector 120. Data read from the memory cell array 110 are transferred to the external device through the column selector 120, the SA & WD circuit 130 and the data I/O circuit 140.

The row decoder 150 receives a row address RA from an external device, decodes the received row address RA, and selects the word lines of the memory cell array 110 according to the decoded row address RA.

The high voltage generator 160 receives a power supply voltage Vcc from an external device. The high voltage generator 160 boosts the received power supply voltage Vcc to a high voltage level.

For example, the high voltage generator 160 boosts the received power supply voltage Vcc to a voltage for driving the row decoder 150 (hereinafter referred to as a row decoder drive voltage Vpp_X), and supplies the row decoder driver voltage Vpp_X to the row decoder 150. For example, the high voltage generator 160 boosts the received power supply voltage Vcc to a voltage for driving the column decoder 170 (hereinafter referred to as a column decoder drive voltage Vpp_Y), and supplies the column decoder driver voltage Vpp_Y to the column decoder 170. For example, the high voltage generator 160 boosts the received power supply voltage Vcc to a voltage for driving the SA & WD circuit 130, and supplies the boosted voltage to the SA & WD circuit 130.

The column decoder 170 receives a column address CA from an external device, decodes the received column address CA, and controls the column selector 120 to select the bit lines according to the decoded column address CA.

The control logic unit 180 receives a control signal CTRL from an external device and controls an overall operation of the nonvolatile memory device 100 according to the received control signal CRTL.

Figure 2:
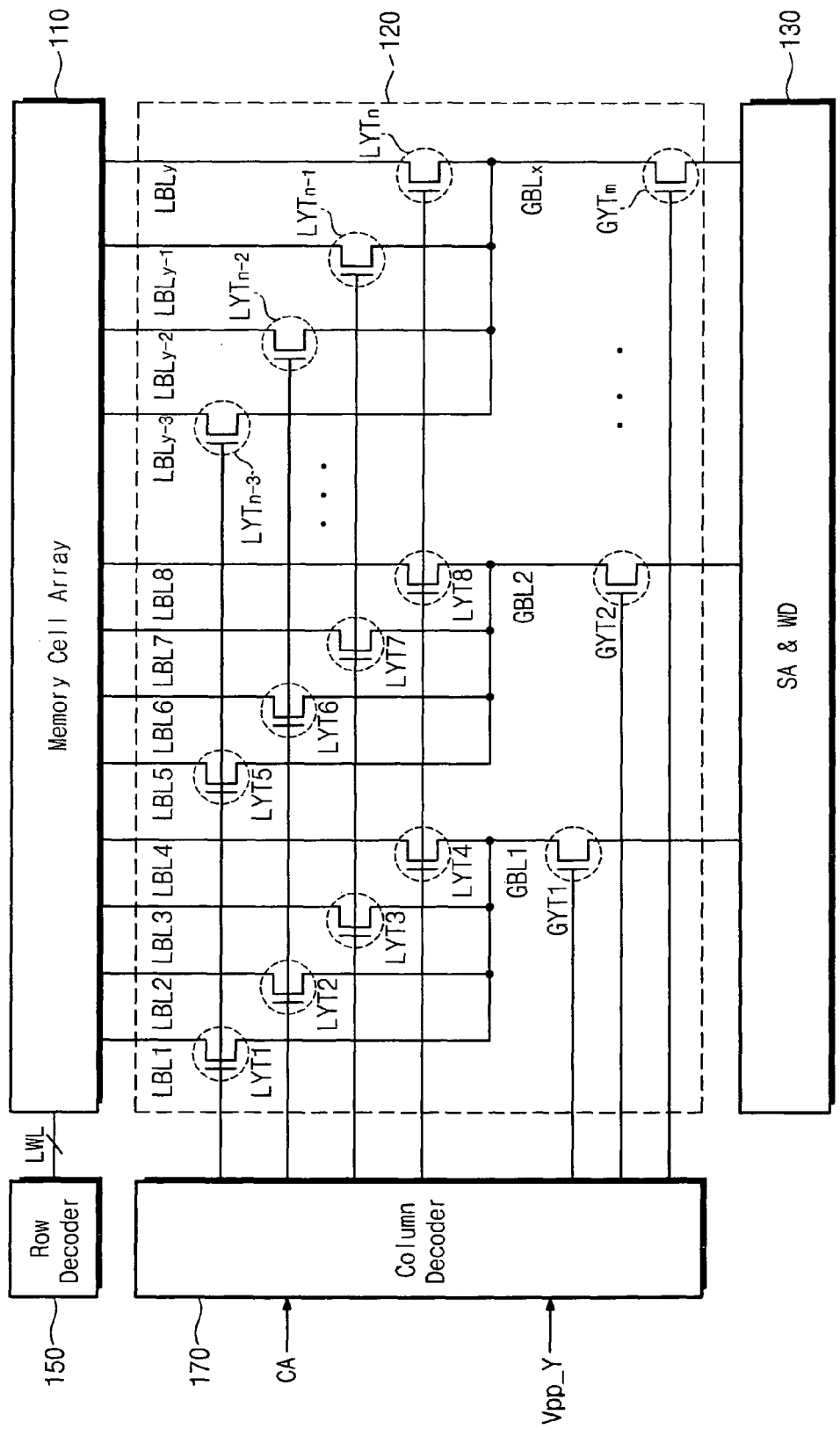
FIG. 2 is a block diagram of a column selector illustrated in FIG. 1, according to an example embodiment.

FIG. 2 is a block diagram of the column selector 120 illustrated in FIG. 1, according to an example embodiment.

Referring to FIG. 2, the column selector 120 includes global column selection transistors GYT and local column selection transistors LYT. In an example embodiment of the inventive concepts, the global column selection transistors GYT are configured to select the global bit lines GBL. Each global bit line GBL is electrically connected to the corresponding local column selection transistors LYT. The local column selection transistors LYT are configured to select the local bit lines LBL.

Referring to FIG. 2, it is assumed that the global bit line GBL1 is selected when the global column selection transistor GYT1 is activated. It is assumed that the global bit line GBL1 is connected to four local column selection transistors LYT1~LYT4. It is assumed that the global bit line GBL2 is selected when the global column selection transistor GYT2 is activated. It is assumed that the global bit line GBL2 is connected to four local column selection transistors LYT5~LYT8. This configuration is merely an example and is not intended to limit the scope of the inventive concepts. For example, the global bit line GBL1 may be electrically connected to one or more local column selection transistors LYT.

Referring to FIGS. 1 and 2, the column decoder 170 receives the column address CA from an external device. The column decoder 170 receives a column decoder drive voltage Vpp_Y from the high voltage generator 160. The column decoder 170 decodes the column address CA. The column decoder 170 selects the global column selection transistor GYT and the local column selection transistor LYT according to the decoded column address CA. The column decoder 170 applies the column decoder drive voltage Vpp_Y to the selected global column selection transistor GYT and/or the selected local column selection transistor LYT.

Referring to FIGS. 1 and 2, the row decoder 150 receives a row address RA from an external device. The row decoder 150 receives a row decoder drive voltage Vpp_X from the high voltage generator 160. The row decoder 150 decodes the row address RA and selects the local word line LWL according to the decoded row address RA. The row decoder 150 applies the row decoder drive voltage Vpp_X to the selected local word line LWL.

However, this is merely an example and is not intended to limit the scope of the inventive concepts. For example, the row decoder 150 may be connected to a row selector (not illustrated), and the row selector may include global row selection transistors GXT (not illustrated) and local row selection transistors LXT (not illustrated). This will be described later in detail with reference to FIG. 5.

The SA & WD circuit 130 writes data in the memory cell (not illustrated) located at the intersection of the selected local bit line LBL and the selected local word line LWL. The SA & WD circuit 130 senses data in the memory cell (not illustrated) located at the intersection of the selected local bit line LBL and the selected local word line LWL. An operation of the nonvolatile memory device 100 according to an example embodiment of the inventive concepts is described below.

Figure 3:
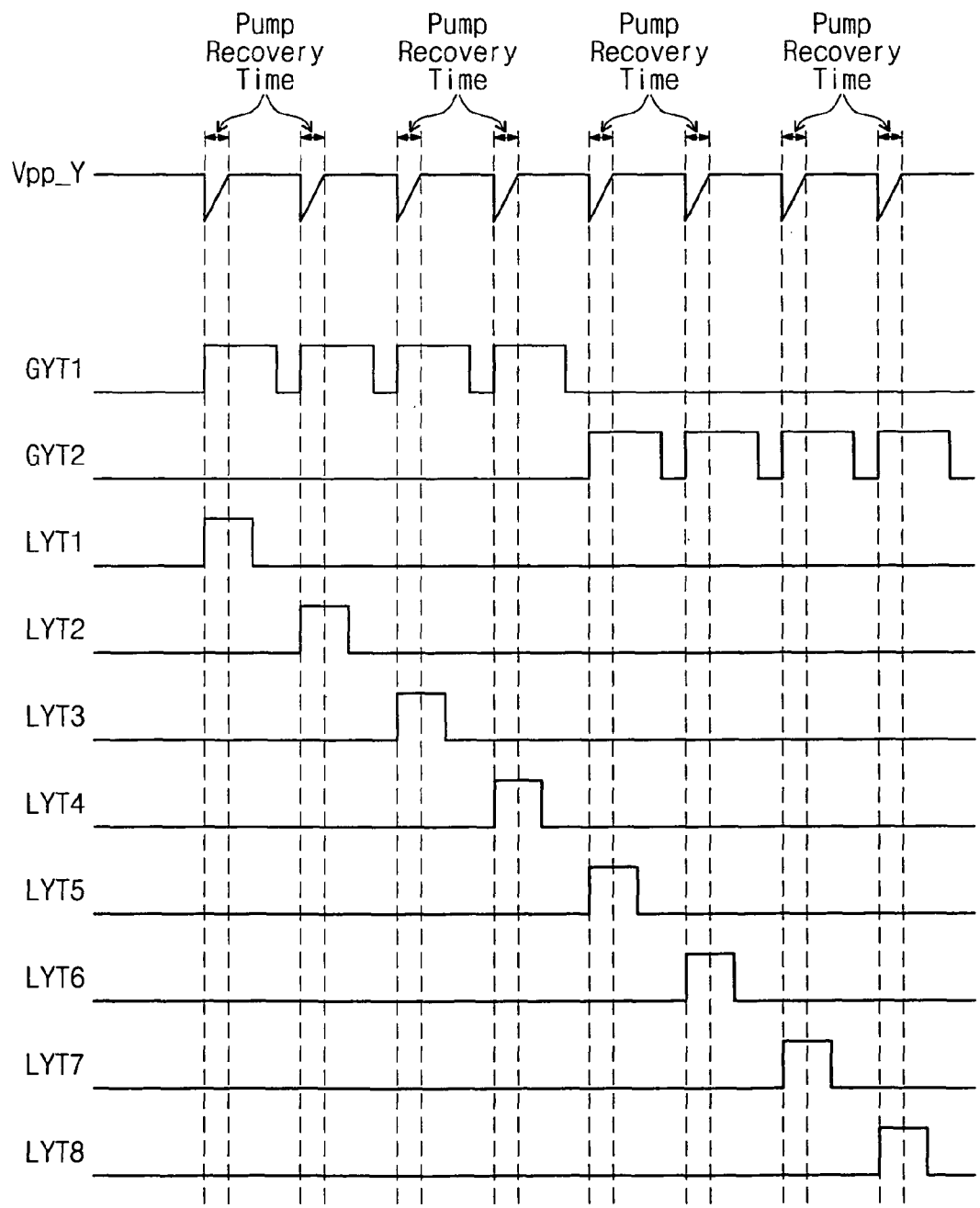
FIG. 3 is a timing diagram illustrating operations of a local column selection transistor and a global column selection transistor according to an example embodiment of the inventive concepts.

FIG. 3 is a timing diagram illustrating operations of the local column selection transistor LYT and the global column selection transistor GYT according to an example embodiment of the inventive concepts.

Referring to FIGS. 1 to 3, it is assumed that the global column selection transistor GYT and the local column selection transistor LYT are simultaneously selected. This operation is merely an example and is not intended to limit the scope of the inventive concepts. For example, the global column selection transistor GYT may be selected first and then the local column selection transistor LYT may be selected. Alternatively, the local column selection transistor LYT may be selected first and then the global column selection transistor GYT may be selected.

It is assumed that the local bit lines LBL are sequentially selected. Again, this operation is merely an example and is not intended to limit the scope of the inventive concepts. For example, the local bit lines LBL may be randomly selected. An example operation of selecting the local bit lines LBL sequentially is described below in detail.

It is assumed that an operation of writing data in the memory cells corresponding to the selected local bit lines LBL (hereinafter referred to as a program operation) is performed. This operation is merely an example and is not intended to limit the scope of the inventive concepts. For example, an operation of reading data written in the memory cells corresponding to the selected local bit lines LBL (hereinafter referred to as a read operation) may be performed. For example, an operation of erasing data written in the memory cells corresponding to the selected local bit lines LBL (hereinafter referred to as an erase operation) may be performed.

First, an example operation of selecting the local bit line LBL1 and programming the memory cell corresponding to the selected local bit line LBL1 will be described.

Referring to FIGS. 1 to 3, the high voltage generator 160 boosts a power supply voltage Vcc to a column decoder drive voltage Vpp_Y with a high voltage level. When the column decoder drive voltage Vpp_Y reaches a desired voltage level, the high voltage generator 160 supplies the column decoder drive voltage Vpp_Y to the column decoder 170.

The column decoder 170 applies the column decoder drive voltage Vpp_Y to a gate of the global column selection transistor GYT1. The global column selection transistor GYT1 is turned on. The column decoder 170 applies the column decoder drive voltage Vpp_Y to a gate of the local column selection transistor LYT1. The local column selection transistor LYT1 is turned on. Thus, the local column selection transistor LYT1 is selected.

The level of the column decoder drive voltage Vpp_Y decreases in the operation of applying the column decoder drive voltage Vpp_Y to the gate of the global column selection transistor GYT1 and the gate of the local column selection transistor LYT1. The decreased column decoder drive voltage is referred to as a low column decoder drive voltage Low Vpp_Y.

When the level of the column decoder drive voltage Vpp_Y decreases, the high voltage generator 160 boosts the low column decoder drive voltage Low Vpp_Y. The time taken to boost the low column decoder drive voltage Low Vpp_Y is referred to as a pump recovery time.

An operation of programming the memory cell corresponding to the local bit line LBL1 may be performed after the pump recovery time. That is, an operation of programming the memory cell corresponding to the local bit line LBL1 may be performed after the low column decoder drive voltage Low Vpp_Y is boosted.

After the memory cell corresponding to the local bit line LBL1 is programmed, the memory cells corresponding to the local bit lines LBL2~LBL8 are sequentially programmed. An operation of selecting the global bit lines GBL1 and GBL2 and the local bit lines LBL2~LBL8 is similar to the above description, and a description thereof is omitted for the sake of brevity.

Referring to FIG. 3, after the respective global bit lines GBL and the corresponding local bit lines LBL are selected, the respective pump recovery times are required. This means an increase in the time taken to perform a program/read/erase operation of the nonvolatile memory device 100.

The column decoder drive voltage Vpp_Y applied to the gate of the selected global column selection transistor GYT or the selected local column selection transistor LYT is merely an example and is not intended to limit the scope of the inventive concepts. For example, an enable signal may be applied to the gate of the selected global column selection transistor GYT or the selected local column selection transistor LYT instead of the column decoder drive voltage Vpp_Y. The enable signal is a signal that is applied to the gate of the transistor to form a channel between the drain and gate of the transistor. For example, the column decoder drive voltage Vpp_Y may be included in the enable signal.

Figure 4:
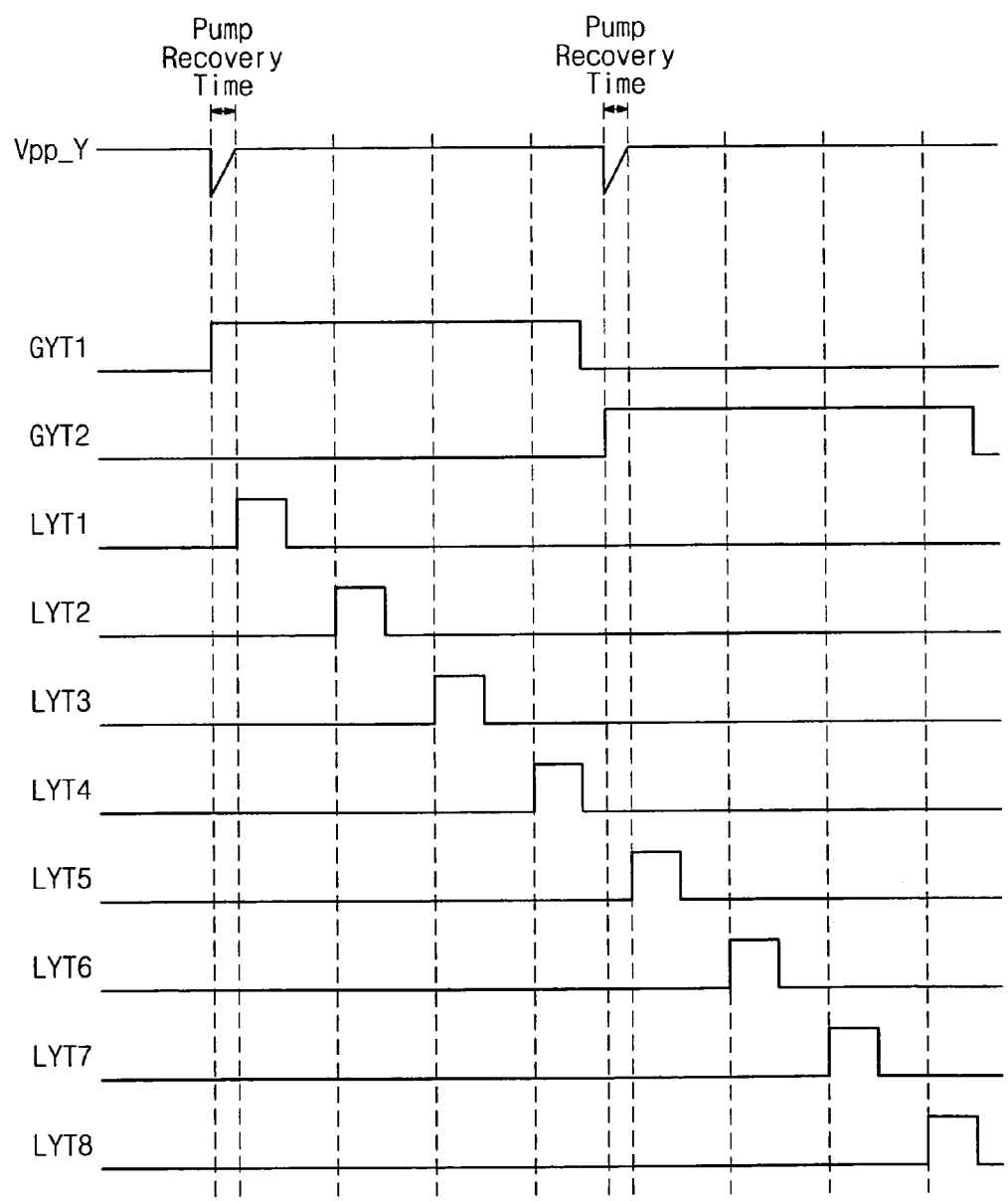
FIG. 4 is a timing diagram illustrating operations of a local column selection transistor and a global column selection transistor according, to another example embodiment of the inventive concepts.

FIG. 4 is a timing diagram illustrating operations of the local column selection transistor LYT and the global column selection transistor GYT according to example another embodiment of the inventive concepts.

Referring to FIGS. 1, 2 and 4, when the global bit line GBL is selected, the local bit lines LBL connected electrically to the selected global bit line GBL are randomly selected. That is, the local column selection transistors LYT corresponding to the activated global column selection transistor GYT are randomly selected while the global column selection transistor GYT maintains an active state. This is to minimize the pump recovery time. An operation thereof is described below.

For sake of brevity, it is assumed that the global column selection transistor GYT is selected and then the local column selection transistor LYT is selected. However, as will be obvious, an alternative is also possible. For example, the local column selection transistor LYT may be selected and then the global column selection transistor GYT may be selected.

It is assumed that the local bit lines LBL are sequentially selected. This is merely an example and is not intended to limit the scope of the inventive concepts. For example, the local bit lines LBL may be randomly selected. For example, two or more of the local bit lines LBL may be simultaneously selected.

It is assumed that an operation of writing data in the memory cells corresponding to the selected local bit lines LBL (hereinafter referred to as a program operation) is performed. This is again merely an example and is not intended to limit the scope of the inventive concepts. For example, an operation of reading data written in the memory cells corresponding to the selected local bit lines LBL (hereinafter referred to as a read operation) may be performed. For example, an operation of erasing data written in the memory cells corresponding to the selected local bit lines LBL (hereinafter referred to as an erase operation) may be performed.

An operation of selecting the global bit lines GBL and the corresponding local bit lines LBL sequentially and programming the memory cell corresponding to the selected local bit line LBL is described below.

First, an operation of selecting the global bit line GBL1 and the corresponding local bit lines LBL1~LBL4 will be described.

Referring to FIGS. 1, 2 and 4, the high voltage generator 160 boosts a power supply voltage Vcc to a column decoder drive voltage Vpp_Y. When the column decoder drive voltage Vpp_Y reaches a desired voltage level, the high voltage generator 160 supplies the column decoder drive voltage Vpp_Y to the column decoder 170.

In response to a column address CA, the column decoder 170 applies the column decoder drive voltage Vpp_Y to a gate of the global column selection transistor GYT1. The global column selection transistor GYT1 is turned on. The level of the column decoder drive voltage Vpp_Y decreases below the desired level of the column decoder drive voltage Vpp_Y in the operation of turning on the global column selection transistor GYT1. That is, the column decoder drive voltage Vpp_Y has a level of the decreased column decoder drive voltage Lowered Vpp_Y. In this case, the high voltage generator 160 boosts the decreased column decoder driver voltage Lowered Vpp_Y to the desired level during the pump recovery time.

When the decreased column decoder drive voltage Lowered Vpp_Y is boosted to the desired level, the column decoder 170 applies the column decoder drive voltage Vpp_Y to the local column selection transistor LYT1 in response to the column address CA. That is, the local column selection transistor LYT1 is turned on and the local bit line LBL1 is selected. When the local bit line LBL1 is selected, the memory cell corresponding to the selected local bit line LBL1 is programmed.

After the memory cells corresponding to the local bit line LBL1 are programmed, the memory cells corresponding to the local bit lines LBL2~LBL4 are programmed. In this case, the global column selection transistor GYT1 continues to maintain an active state. That is, the local column selection transistors LYT2~LYT4 corresponding to the global column selection transistor GYT1 are turned on while the global column selection transistor GYT1 is turned on. An operation of selecting the local column selection transistors LYT2~LYT4 is similar to the operation of selecting the local column selection transistor LYT1, and its description is omitted for the sake of brevity.

After the memory cells corresponding to the local bit lines LBL1~LBL4 are programmed, the memory cells corresponding to the local bit lines LBL5~LBL8 are programmed. In this case, the local bit lines LBL5~LBL8 are selected while the global column selection transistor GYT2 is turned on. An operation of selecting the local bit lines LBL5~LBL8 is similar to the above description with respect to local bit lines LBL1~LBL4, and a detailed description thereof will be omitted for the sake of brevity.

As described above, in an example embodiment of the inventive concepts, the local column selection transistors LYT1~LYT4 corresponding to the global column selection transistor GYT1 are randomly activated while the global column selection transistor GYT1 is activated. In this case, the high voltage generator 160 performs one boost operation. That is, the high voltage generator 160 performs a boost operation when the global column selection transistor GYT1 is activated.

Thereafter, the local column selection transistors LYT5~LYT8 corresponding to the global column selection transistor GYT2 are randomly activated while the global column selection transistor GYT2 is activated. In this case, the high voltage generator 160 performs one boost operation. That is, the high voltage generator 160 performs a boost operation when the global column selection transistor GYT2 is activated.

Referring to FIG. 4, in an example embodiment of the inventive concepts, the global bit line GBL is selected and the selected global bit line GBL remains in an active state. The local bit lines LBL corresponding to the selected global bit line GBL are randomly selected while the selected global bit line GBL maintains an active state.

In an example embodiment of the inventive concepts, the pump recovery time is required when the global bit line GBL is selected. Thus, in comparison with the embodiment of FIG. 3, the embodiment of FIG. 4 may reduce the time taken to perform a program/read/erase operation.

For example, the embodiment of FIG. 3 requires eight pump recovery times in the operation of selecting the global bit lines GBL and the local bit lines LBL. However, the embodiment of FIG. 4 requires two pump recovery times in the operation of selecting the global bit lines GBL and the local bit lines LBL.

Meanwhile, the column decoder drive voltage Vpp_Y is merely an example and is not intended to limit the scope of the inventive concepts. For example, the column decoder drive voltage Vpp_Y may be included in the enable signal.

Meanwhile, the operations of global transistors GT and local transistors LT in the column selector 120 in FIG. 4 may also be applicable to a row selector (not illustrated). This is described below with reference to FIG. 5.

Figure 5:
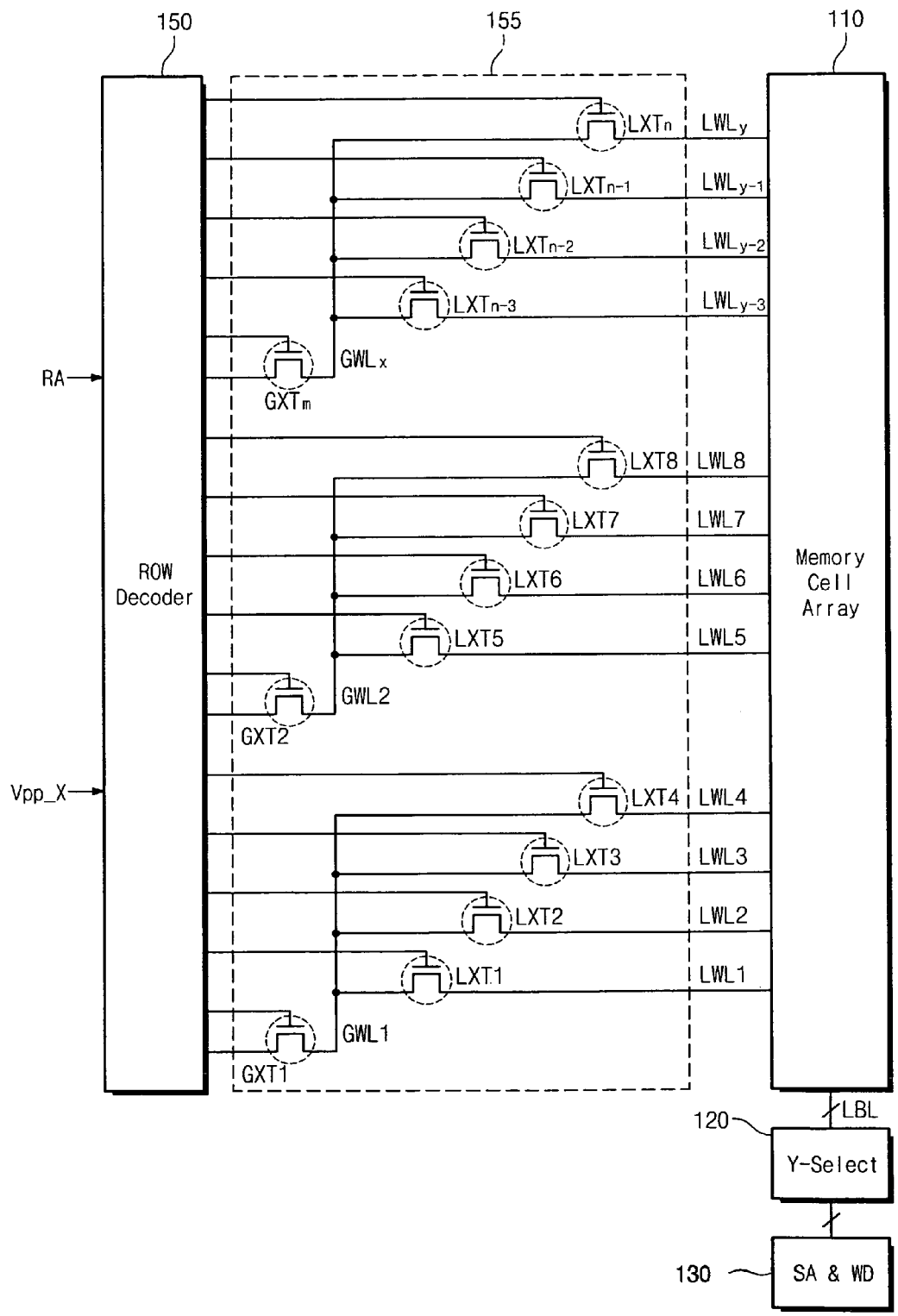
FIG. 5 is a block diagram of a row selector according to an example embodiment of the inventive concepts.

FIG. 5 is a block diagram of a row selector according to an example embodiment of the inventive concepts.

Referring to FIG. 5, a row selector 155 includes global row selection transistors GXT and local row selection transistors LXT. In an example embodiment of the inventive concepts, the global row selection transistors GXT are configured to select the global word lines GWL. Each of the global word lines GWL is electrically connected to the corresponding local row selection transistors LXT. The local row selection transistors LXT are configured to select the local word lines LWL.

For the sake of brevity, it is assumed that the global row selection transistor GXT1 selects the global word line GWL1. It is assumed that the global word line GWL1 is electrically connected to four local row selection transistors LXT1~LXT4. It is assumed that the global row selection transistor GXT2 selects the global word line GWL2. It is assumed that the global word line GWL2 is electrically connected to four local row selection transistors LXT5~LXT8. However, this configuration is merely an example and is not intended to limit the scope of the inventive concepts. For example, the global word line GWL1 may be electrically connected to one or more local word lines LWL.

Referring to FIGS. 1 and 5, the row decoder 150 receives a row address RA from an external device. The row decoder 150 receives a row decoder drive voltage Vpp_X from the high voltage generator 160. The row decoder 150 decodes the row address RA and selects the global row selection transistor GXT or the local row selection transistor LXT according to the decoded row address RA. The row decoder 150 applies the row decoder drive voltage Vpp_X to the selected global row selection transistor GXT or the selected local row selection transistor LXT. When the row decoder drive voltage Vpp_X is applied to the gate of the selected global row selection transistor GXT, the global word line GWL connected to the selected global row selection transistor GXT is selected. When the row decoder drive voltage Vpp_X is applied to the gate of the selected local row selection transistor LXT, the local word line LWL connected to the selected local row selection transistor LXT is selected.

The SA & WD circuit 130 writes data in the memory cell (not illustrated) located at the intersection of the selected local bit line LBL and the selected local word line LWL. The SA & WD circuit 130 senses data from the memory cell (not illustrated) located at the intersection of the selected local bit line LBL and the selected local word line LWL.

In an example embodiment of the inventive concepts, the local row selection transistors LXT1~LXT4 corresponding to the global row selection transistor GXT1 are randomly activated while the global row selection transistor GXT1 maintains an active state. This operation is somewhat similar to the operation of FIG. 4, and thus a detailed description thereof is omitted for the sake of brevity.

Thereafter, the global row selection transistor GXT2 is activated. The local row selection transistors LXT5~LXT8 corresponding to the global row selection transistor GXT2 are randomly activated while the global row selection transistor GXT2 maintains an active state. This operation is somewhat similar to the operation of FIG. 4, and thus a detailed description thereof is omitted for the sake of brevity.

The row decoder drive voltage Vpp_X applied to the gate of the selected global row selection transistor GXT or the selected local row selection transistor LXT is merely an example and is not intended to limit the scope of the inventive concepts. For example, an enable signal may be applied to the gate of the selected global row selection transistor GXT or the selected local row selection transistor LXT, and the row decoder drive voltage Vpp_X may be included in the enable signal.

Figure 6:
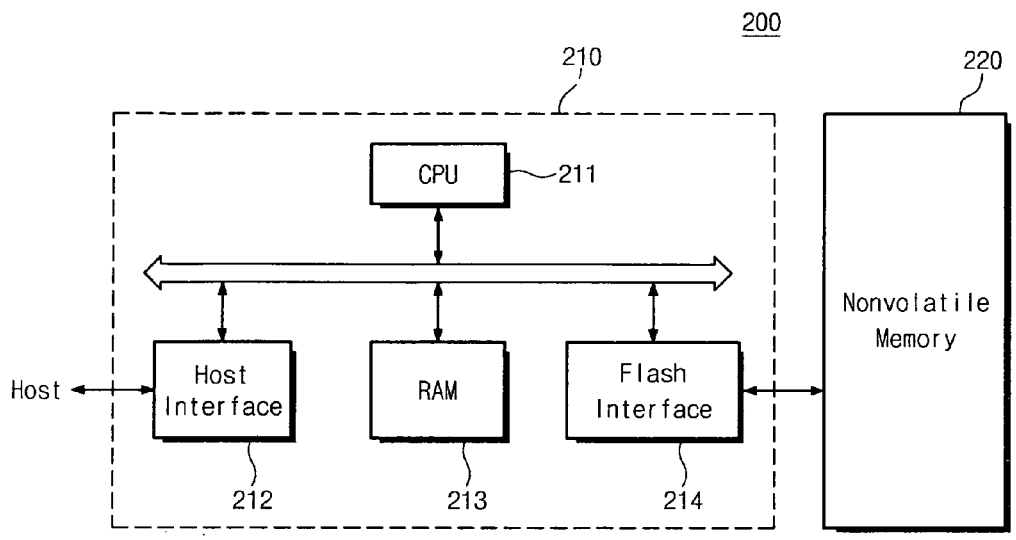
FIG. 6 is a block diagram of a semiconductor memory device according to an example embodiment of the inventive concepts.

FIG. 6 is a block diagram of a semiconductor memory device using a program method according to an example embodiment of the inventive concepts.

Referring to FIG. 6, a semiconductor memory device 200 includes, a memory controller 210 and a nonvolatile memory 220. Examples of the semiconductor memory device 200 include, but not limited to, storage devices including nonvolatile memory devices, such as memory cards (e.g., SDs and MMCs) and portable mobile storages (e.g., USB memories).

The memory controller 210 includes a central processing unit (CPU) 211, a host interface 212, a random access memory (RAM) 213, and a flash interface 214. The nonvolatile memory 220 may be the nonvolatile memory device 100 illustrated in FIG. 1, for example.

Figure 7:
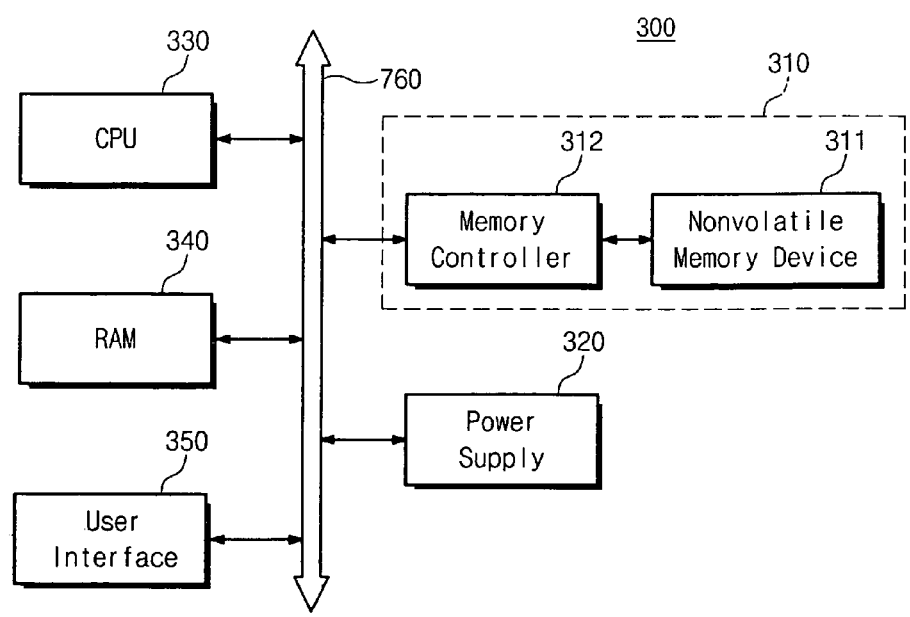
FIG. 7 is a block diagram of a user device according to an example embodiment of the inventive concepts.

FIG. 7 is a block diagram of a user device using a program method according to an example embodiment of the inventive concepts.

Referring to FIG. 7, a user device 300 may be implemented as a personal computer (PC) or a portable electronic device such as a notebook computer, a portable phone, a personal digital assistant (PDA), a camera, or the like.

The user device 300 includes a bus/power line 760, a memory system 310, a power supply 320, a CPU 330, a RAM 340, and a user interface 350. The memory system 310 includes a nonvolatile memory device 311 and a memory controller 312.

The memory controller 312 is connected to a host and the nonvolatile memory device 311. The memory controller 312 transfers data, read from the nonvolatile memory device 311, to the host and stores data, received from the host, in the nonvolatile memory device 311.

The memory controller 312 may include a random access memory (RAM), a processing unit, a host interface, and a memory interface. The RAM may be used as a working memory of the processing unit. The processing unit may control an overall operation of the memory controller 312. The host interface may include a protocol for data exchange between the host and the memory controller 312. For example, the memory controller 312 may be configured to communicate with an external device (e.g., the host) using one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), IDE (Integrated Drive Electronics) or the like. The memory interface may interface with the nonvolatile memory device 311. The memory controller 312 may further include an error correction block. The error correction block may be configured to detect and correct an error in data read from the nonvolatile memory device 311.

The nonvolatile memory device 311 may include a memory cell array that stores data, a read/write circuit for reading/writing data from/in the memory cell array, an address decoder that decodes an address received from an external device and transfers the same to the read/write circuit, and a control logic circuit that controls an overall operation of the nonvolatile memory device 311.

The memory controller 312 and the nonvolatile memory device 311 may be integrated into one semiconductor device. As an example, the memory controller 312 and the nonvolatile memory device 311 may be integrated into one semiconductor device to comprise a memory card. For example, the memory controller 312 and the nonvolatile memory device 311 may be integrated into one semiconductor device to comprise a PC card (e.g., PCMCIA (Personal Computer Memory Card International Association)), a compact flash card (CF), a smart media card (SM/SMC), a memory stick, a multimedia card (e.g., MMC, RS-MMC and MMCmicro), a SD card (e.g., SD, miniSD, and microSD), a universal flash storage (UFS) or the like.

As another example, the memory controller 312 and the nonvolatile memory device 311 may be integrated into one semiconductor device to comprise a solid state disk/drive (SSD). When the memory system 310 is used as an SSD, the operation speed of the host connected to the memory system 310 may increase significantly.

As another example, the memory system 310 may be used in PDAs, portable computers, web tablets, wireless phones, mobile phones, digital music players, devices capable of transmitting/receiving information in wireless environments or the like.

As another example, the nonvolatile memory device 311 or the memory system 310 may be mounted in various types of packages. Examples of the packages of the nonvolatile memory device 311 or the memory system 310 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-level Processed Stack Package (WSP) or the like.

According to the example embodiments of the inventive concepts, the local bit lines corresponding to the global bit line are selected while the global bit line maintains an active state, thus reducing the program time, the read time or the erase time.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for controlling lines of a nonvolatile memory device, comprising:
   selectively activating a global selection line of the nonvolatile memory device; and
   selectively activating at least two local selection lines of the nonvolatile memory device, the activated local selection lines being connected to the global selection line while the global selection line is activated; and
   supplying a boosted power supply voltage to selectively activate the global selection line and the local selection line.

2. The method of claim 1, further comprising:
   selectively activating the local selection lines connected to the global selection line in a random order.

3. The method of claim 1, further comprising:
   selectively activating the at least two local selection lines connected to the global selection line in a sequential order.

4. A nonvolatile memory device, comprising:
   a plurality of global selection lines;
   a plurality of local selection lines corresponding to the plurality of global selection lines;
   a first selection circuit connected to the plurality of global selection lines and configured to select at least one of the plurality of global selection lines;
   a second selection circuit connected between the plurality of global selection lines and the plurality of local selection lines and configured to select the local selection lines; and
   a voltage generator configured to generate a boosted power supply voltage, wherein
   the first selection circuit is configured to select at least one global selection line of the plurality of global selection lines,
   the second selection circuit is configured to select at least two local selection lines of the plurality of local selection lines, the selected at least two local selection lines corresponding to the selected at least one global selection line and the at least two local selection lines selected while the at least one global selection line is activated, and
   the voltage generator is configured to generate the boost power supply voltage such that the boost power supply voltage is boosted once after the global selection line is activated and before the at least two local selection lines are activated.

5. The nonvolatile memory device of claim 4, wherein the second selection circuit is configured to select the at least two local selection lines in a random order while the selected global selection line is continuously activated.

6. The nonvolatile memory device of claim 4, wherein the first selection circuit comprises global transistors connected to the global selection lines, wherein
　the global transistors are configured to select the at least one global selection line in response to a global select signal, and
　the global select signal is continuously activated and supplied to selected global transistor while the local selection lines corresponding to the selected global transistor are selected.

7. The nonvolatile memory device of claim 6, wherein the second selection circuit comprises a plurality of local transistors connected to the plurality of local selection lines, wherein
　the plurality of local transistors are configured to select the plurality of local selection lines in response to a local select signal,
　the local select signal is supplied to at least two local transistors of the plurality of local transistors in a random order while the selected at least one global selection line is continuously activated, and
　the at least two local transistors correspond to the selected at least one global selection line.

8. The nonvolatile memory device of claim 7, wherein the boost power supply voltage is not boosted while the local select signal is supplied to at least two selected local transistors.

9. The nonvolatile memory device of claim 4, wherein the second selection circuit is configured to sequentially select the at least two local selection lines corresponding to the selected at least one global selection line while the selected global selection line is activated.

* * * * *